United States Patent
Nakajima et al.

(10) Patent No.: US 6,483,690 B1
(45) Date of Patent: Nov. 19, 2002

(54) CERAMIC ELECTROSTATIC CHUCK ASSEMBLY AND METHOD OF MAKING

(75) Inventors: Shu Nakajima, Chigasaki (JP); Neil Benjamin, Palo Alto, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 09/892,634

(22) Filed: Jun. 28, 2001

(51) Int. Cl.[7] ............................................. H01T 23/00
(52) U.S. Cl. ...................................................... 361/234
(58) Field of Search ................................. 361/234, 235, 361/230, 231, 233

(56) References Cited

U.S. PATENT DOCUMENTS

| | | |
|---|---|---|
| 4,381,198 A | 4/1983 | Kondo et al. |
| 4,677,254 A | 6/1987 | Boss et al. |
| 4,799,958 A | 1/1989 | Morris et al. |
| 4,806,160 A | 2/1989 | Hagiwara et al. |
| 4,835,039 A | 5/1989 | Barringer et al. |
| 4,861,641 A | 8/1989 | Foster et al. |
| 4,894,273 A | 1/1990 | Lieberman et al. |
| 4,920,640 A | 5/1990 | Enloe et al. |
| 4,940,849 A | 7/1990 | Morris et al. |
| 5,055,964 A | 10/1991 | Logan et al. |
| 5,151,845 A | 9/1992 | Watanabe et al. |
| 5,155,652 A | 10/1992 | Logan et al. |
| 5,191,506 A | 3/1993 | Logan et al. |
| 5,207,437 A | 5/1993 | Barnes et al. |
| 5,292,552 A | 3/1994 | Yamakawa et al. |
| 5,671,116 A | 9/1997 | Husain |
| 5,838,529 A | 11/1998 | Shufflebotham et al. |
| 5,880,922 A | 3/1999 | Husain |
| 5,886,863 A | 3/1999 | Nagasaki et al. |
| 5,932,326 A | 8/1999 | Kashima et al. |
| 5,958,813 A | 9/1999 | Aida et al. |
| 5,969,934 A | 10/1999 | Larsen |
| 5,986,874 A | 11/1999 | Ross et al. |
| 6,028,762 A | 2/2000 | Kamitani |
| 6,071,630 A | 6/2000 | Tomaru et al. |
| 6,074,893 A | 6/2000 | Nakata et al. |
| 6,101,969 A | 8/2000 | Niori et al. |
| 6,122,159 A | 9/2000 | Arai et al. |

FOREIGN PATENT DOCUMENTS

WO    WO 01/04945    1/2001

*Primary Examiner*—Edward H. Tso
(74) *Attorney, Agent, or Firm*—Burns, Doane, Swecker & Mathis, LLP

(57) ABSTRACT

A sintered ceramic electrostatic chucking device (ESC) which includes a patterned electrostatic clamping electrode embedded in a ceramic body wherein the clamping electrode includes at least one strip of a sintered electrically conductive material arranged in a fine pattern. Due to the fineness of the electrode pattern employed, stresses induced during manufacture of the ESC are reduced such that the clamping electrode remains substantially planar after the sintering operation. The resulting ESC allows for improved clamping uniformity. Another ESC includes an insulating or semi-conducting body and a clamping electrode having a high resistivity and or a high lateral impedance. The electrostatic chucking device provides improved RF coupling uniformity when RF energy is coupled thorough the clamping electrode from an underlying RF electrode. The RF electrode can be a separate baseplate or it can be a part of the chuck. The ESC's may be used to support semiconductor substrates such as semiconductor wafers in plasma processing equipment.

32 Claims, 4 Drawing Sheets

CERAMIC ELECTROSTATIC CHUCK ASSEMBLY AND METHOD OF MAKING

FIELD OF THE INVENTION

The invention relates to a ceramic electrostatic chuck (ESC) useful in the manufacture of semiconductor devices.

BACKGROUND OF THE INVENTION

Electrostatic chucks are used to hold semiconductor wafers and other substrates in place in various types of processing equipment including plasma processing equipment. Electrostatic chucks typically include one or more conductive electrodes underlying a dielectric (insulating) or semi-conductive ceramic layer across which an electrostatic clamping field can be developed. Unlike mechanical clamping devices, electrostatic chucks allow an entire surface of the substrate to be exposed to the plasma. Additionally, the electrostatic chuck clamps the substrate more uniformly to the baseplate to allow a greater degree of control of the wafer temperature.

Various electrode patterns are known for use with electrostatic chucks. With mono-polar electrodes, the electrode is typically in the form of a flat plate. With bipolar electrodes, the separate electrodes have been arranged as half disks or as an inner disk and an outer annulus. Examples of bipolar chucks of this type are disclosed in Tomaru et al. (U.S. Pat. No. 6,071,630) and Logan et al. (U.S. Pat. No. 5,055,964). Electrode patterns have also been proposed where the electrodes are arranged in comb patterns. See, for example, Barnes et al. (U.S. Pat. No. 5,207,437). Other patterns are disclosed in Shufflebotham et al. (U.S. Pat. No. 5,838,529) and Logan et al. (U.S. Pat. No. 5,155,652).

Electrostatic chucking devices which utilize ceramic materials are disclosed in U.S. Pat. Nos. 5,151,845; 5,191,506; 5,671,116; 5,886,863; 5,986,874; 6,028,762; 6,071,630; 6,101,969; and 6,122,159. Ceramic ESCs are typically made using multi-layer ceramic packaging technology. Multi-layer ceramic packaging technology involves printing refractory metal patterns on ceramic green sheets, assembling the sheets into laminates and co-firing the resulting assemblies. See, for example, U.S. Pat. Nos. 4,677,254; 4,920,640; 5,932,326; 5,958,813; and 6,074,893. Various metallizing compositions for use with ceramic substrates are disclosed in U.S. Pat. Nos. 4,381,198; 4,799,958; 4,806,160; 4,835,039; 4,861,641; 4,894,273; 4,940,849; 5,292,552; 5,932,326 and 5,969,934.

Since the sintering of ceramic ESCs is normally conducted at very high temperatures, differences in the coefficient of thermal expansion between the electrode material and the ceramic material can cause the build-up of internal stresses in the chuck. These internal stresses can lead to warping or, in some cases, actual damage to the ceramic ESC. Accordingly, there is a need in the art for overcoming warping and other problems associated with the build-up of internal stresses during manufacture of ceramic ESCs.

Also, since the radio frequency (RF) power used to generate the plasma and to bias the substrate is typically applied to a separate electrode underlying the ESC clamping electrode, it would be desirable in such cases to maximize the RF transparency of the clamping electrode.

SUMMARY OF THE INVENTION

In a first embodiment of the invention, a sintered ceramic electrostatic chucking device is provided. The chucking device includes an electrostatic clamping electrode embedded in a joint-free monolithic sintered ceramic body. The clamping electrode includes at least one pattern of a substantially planar electrically conductive material wherein the maximum straight line length in the electrode pattern is 1.0 inch. In a preferred embodiment of the invention, the maximum straight line length in the electrode pattern is 0.25 inches. The electrode pattern can comprise a single electrically conductive pattern or at least two electrically isolated patterns of conductive material.

A method of making the sintered ceramic electrostatic chucking device set forth above is also provided. The method comprises steps of: providing a first layer comprising a ceramic material in a green state; forming a pattern of at least one strip of an electrically conductive material on a first major surface of the first layer; providing a second layer comprising ceramic material in green state; assembling the second layer on the first major surface of the first layer; and cofiring the first and second layers to form a monolithic joint-free sintered ceramic body with an embedded electrode layer. Due to the characteristics of the electrode pattern employed, the sintered electrode layer remains substantially planar after firing. In a preferred embodiment of the method set forth above, the forming step comprises forming a pattern from a paste comprising particles of an electrically conductive material and the cofiring step comprises sintering the particles of the electrically conductive material to form a sintered clamping electrode.

A method of treating a substrate in a process chamber including the aforementioned electrostatic chucking device is also provided. The method comprises steps of: electrostatically clamping the substrate to the electrostatic chucking device and processing the substrate. The method can also include steps of coupling RF energy of at least one frequency through the electrostatic chucking device to generate a plasma adjacent the exposed surface of the substrate and processing the substrate with the plasma.

In a second embodiment of the present invention, an electrostatic chucking device useful for supporting semiconductor substrates in a semiconductor processing chamber is provided. The chucking device includes a body of electrically insulating or semi-conductive material having a support surface on which a semiconductor substrate can be electrostatically clamped and a clamping electrode adapted to electrostatically clamp the substrate to the support surface. The chucking device also includes a lower electrode adapted to couple radio frequency energy through the clamping electrode and into an open space in the vicinity of a substrate clamped to the support surface. In a first embodiment of this electrostatic chucking device, the clamping electrode has a resistivity such that the clamping electrode is highly transparent to the coupling of radio frequency energy into the plasma chamber. In a second embodiment of this electrostatic chucking device, a substantially uniform distribution of radio frequency energy develops across the lower electrode when radio frequency power is applied thereto and the clamping electrode has a sufficiently high lateral radio frequency impedance in a direction parallel to the support surface such that radio frequency power coupled through the clamping electrode and into the plasma chamber is substantially uniformly distributed across the substrate support surface.

A method of treating a semiconductor substrate in a process chamber including an electrostatic chucking device as set forth above is also provided. The method includes steps of electrostatically clamping the substrate to the electrostatic chucking device and coupling RF energy of at least one frequency through the electrostatic chucking device.

BRIEF DESCRIPTION OF THE DRAWINGS

FIGS. 1A–D show steps involved in a prior art method of manufacturing a sintered ceramic ESC wherein

FIGS. 2A–C show steps involved in manufacturing a sintered ceramic ESC according to the present invention wherein

DERAILED DESCRIPTION OF THE PREFERRED EMBODIMENTS

It is desirable in the fabrication of a electrostatic chucks to keep both the substrate support surface of the chuck and any electrode structures buried within it flat and parallel. Non-flatness of the chuck can cause problems such as poor mechanical contact of the wafer to the chuck surface which can result in low clamping force. Non-flatness can also result in non-uniform electrical coupling (both electrostatic and RF) during plasma processing. Non-uniformities in chuck thickness and electrode flatness can also cause local variations in capacitance. During plasma processing of a substrate, these variations can lead to inadequate clamping and non-uniform etching or deposition and can even result in damage to the substrate being processed.

Sintered ceramic chucks are commonly used for semi-conductor processing. A sintered ceramic ESC typically consists of a ceramic disk containing at least one electrode layer buried within it. Sintered ceramic chucks are typically made using multi-layer ceramic packaging technology in which conductive refractory metal patterns are printed on one or more ceramic green sheets using a conductive paste or ink. The conductive pattern is then sandwiched by laying a second green sheet on top of the first green sheet and co-firing the assembly. During firing, the ceramic particles in the green sheets become sintered to form a monolithic joint-free ceramic body. The conductive particles in the paste also become sintered to form an embedded electrode layer.

Internal stresses which develop in sintered ceramic chucks during manufacture can lead to warping. A major cause of these internal stresses is the difference between the coefficients of thermal expansion (CTE) of the ceramic material of the chuck body and the electrode material. The stresses induced by these CTE differences can lead to deformation or damage of the sintered chuck. The present inventors have discovered that, by using a finely divided clamping electrode pattern, the tendency of the ceramic chuck to warp during sintering can be reduced. It is thus an object according to a first embodiment of the present invention to employ an ESC electrode pattern which reduces the tendency of the ESC to warp during the high temperatures encountered in the manufacture of sintered ceramic ESCs.

In various plasma processes, a lower electrode or base plate can be used to supply RF power to produce a plasma in the open space above the substrate and/or to couple RF bias power through the ESC to the plasma. In those arrangements in which RF energy is coupled through the clamping electrode, it may be desirable to provide an ESC that is highly transparent to RF energy. Conventional electrostatic chucks employ highly conductive clamping electrode materials such as high-purity tungsten arranged in a continuous pattern. These conductive clamping electrodes, however, can disturb the RF coupling and thus lead to non-uniform processing or even damage to the substrate being processed. It is thus an object according to a second embodiment of the present invention to improve RF coupling uniformity when RF power is coupled through the clamping electrode by increasing the resistivity and/or otherwise raising the lateral impedance of the clamping electrode.

In accordance with the first embodiment of the present invention, a method is provided for reducing the warping of a sintered ceramic electrostatic chucking device during manufacture. The method comprises using a finely divided clamping electrode pattern which is suitable for both mono-polar and bi-polar implementation. Use of the fine electrode pattern reduces internal stresses which develop during sintering and which can lead to deformation and/or damage of the chuck.

FIG. 1 illustrates the warping that can occur during conventional sintering of ceramic ESCs with embedded electrodes. FIG. 1A shows the components prior to assembly wherein a clamping electrode pattern layer 2 is disposed on a first ceramic green sheet 4 to be bonded via sintering to a second ceramic green sheet 6. FIG. 1B shows the assembled components prior to sintering wherein the first ceramic green sheet 4 and the second ceramic green sheet 6 sandwich the electrode pattern layer 2 therebetween. The electrode pattern layer 2 comprises a pattern of conductive material which can be applied to the green sheet as a paste of conductive particles by a printing method such as screen printing.

Figure 1A:
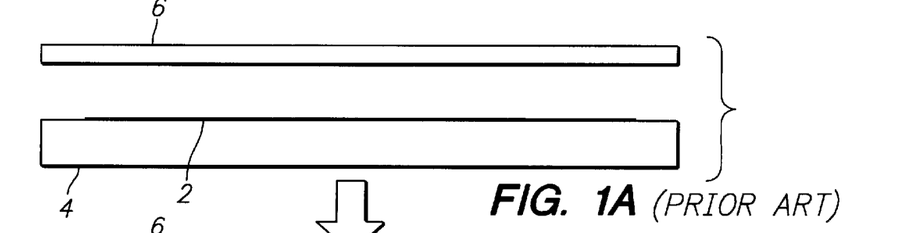
FIG. 1A shows the chuck components prior to assembly.
Figure 1B:
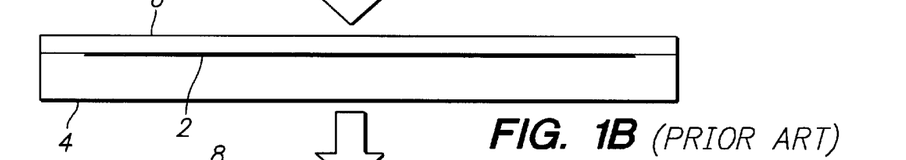
FIG. 1B shows the assembled components prior to sintering.
Figure 1C:
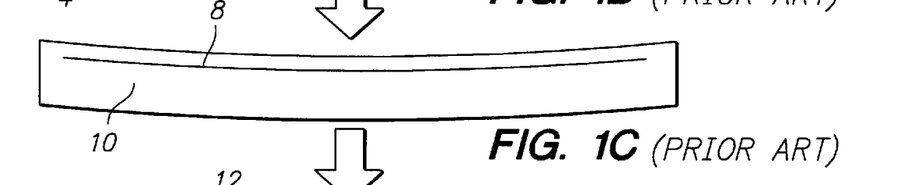
FIG. 1C shows the ceramic chuck in a deformed state after sintering and FIG. 1D shows the chuck after grinding to restore flatness to the external surfaces.
Figure 1D:
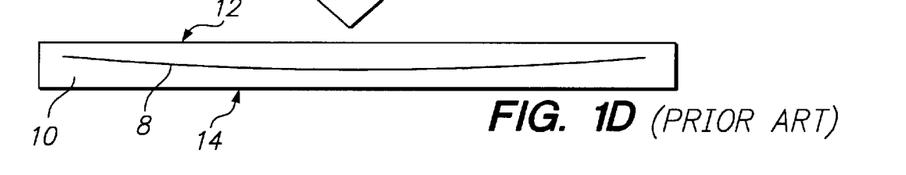

FIG. 1C shows a cross section of the assembled components of FIG. 1B after sintering. The electrode 8 is shown embedded in a sintered ceramic body 10. As can be seen from FIG. 1C, the sintered ceramic ESC has become warped or domed. The warped chuck can be subjected to grinding and polishing operations to restore flatness to the upper surface of the sintered chuck. This additional step, however, adds to the cost of the finished chuck. Further, even after grinding the external surface flat, the warped internal electrode structure will not be parallel to the upper surface. This effect can be seen in FIG. 1D, which shows the warped sintered ceramic chuck after a grinding operation to restore flatness to the external surfaces. As a result of the grinding operation, the distance between the electrode 8 and the upper and lower surfaces 12, 14 of the chuck can vary across the surface of the chuck. This effect is particularly pronounced when the ceramic disk is made very thin to aid in both thermal and RF power transmission.

Figure 2A:
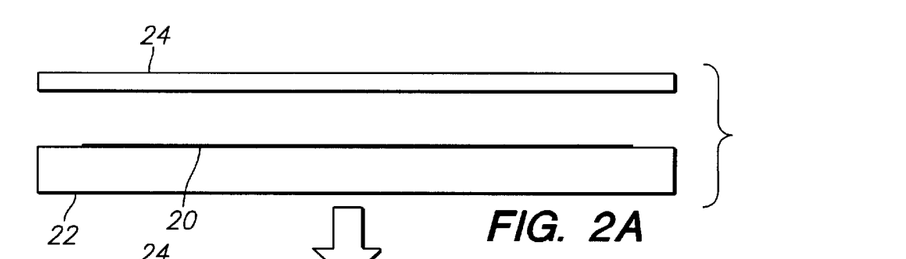
FIG. 2A shows the chuck components prior to assembly.
Figures 2B, 2C:
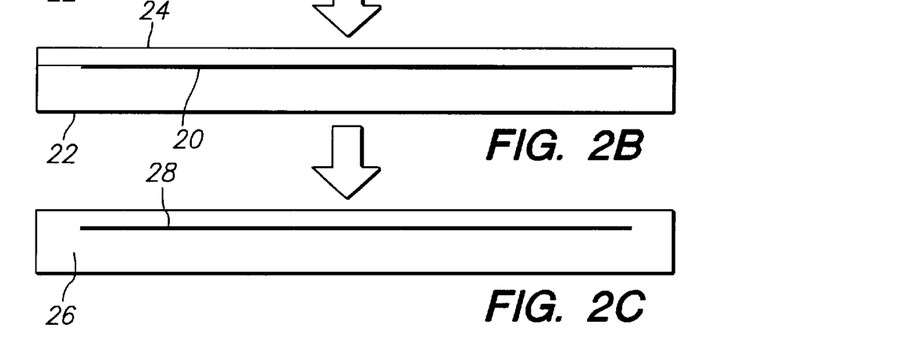
FIG. 2B shows the assembled components prior to sintering and FIG. 2C shows the sintered chuck in final form.

FIG. 2 shows steps involved in forming a sintered ceramic chuck according to one embodiment of the present invention. FIG. 2A shows the components prior to assembly wherein a clamping electrode pattern layer according to the present invention 20 is disposed on a first ceramic green sheet 22 to be bonded to a second ceramic green sheet 24. The assembled chuck components prior to sintering are shown in FIG. 2B wherein the first ceramic green sheet 22 and the second ceramic green sheet 24 sandwich the electrode pattern layer 20 therebetween. The electrode pattern layer 20 includes a fine pattern of conductive strips. The strips can be made from a paste of conductive particles applied by a printing method such as screen printing. Other methods of forming the electrode pattern, however, can also be employed. FIG. 2C shows a cross section of the ESC of the invention after sintering. The green sheets have now become a joint-free monolithic sintered ceramic body 26 with an embedded electrode layer 28. Due to the fine electrode pattern employed, however, the major external surface of the ceramic ESC remain substantially flat and the embedded electrode remains substantially planar after the sintering operation.

The particular configuration of the fine electrode pattern employed is not critical as long as the maximum straight line segment length of the electrode pattern is no more than 1.0 inch. That is, in a fine electrode pattern according to the present invention, no straight line segment greater than 1.0 inch can extend in any direction on any continuous portion of the electrode pattern. More preferably, no straight line segment greater than 0.5 inches in length, and even more preferably no straight line segment greater than 0.25 inches, can extend in any direction on any portion of the electrode pattern.

Figure 3A:
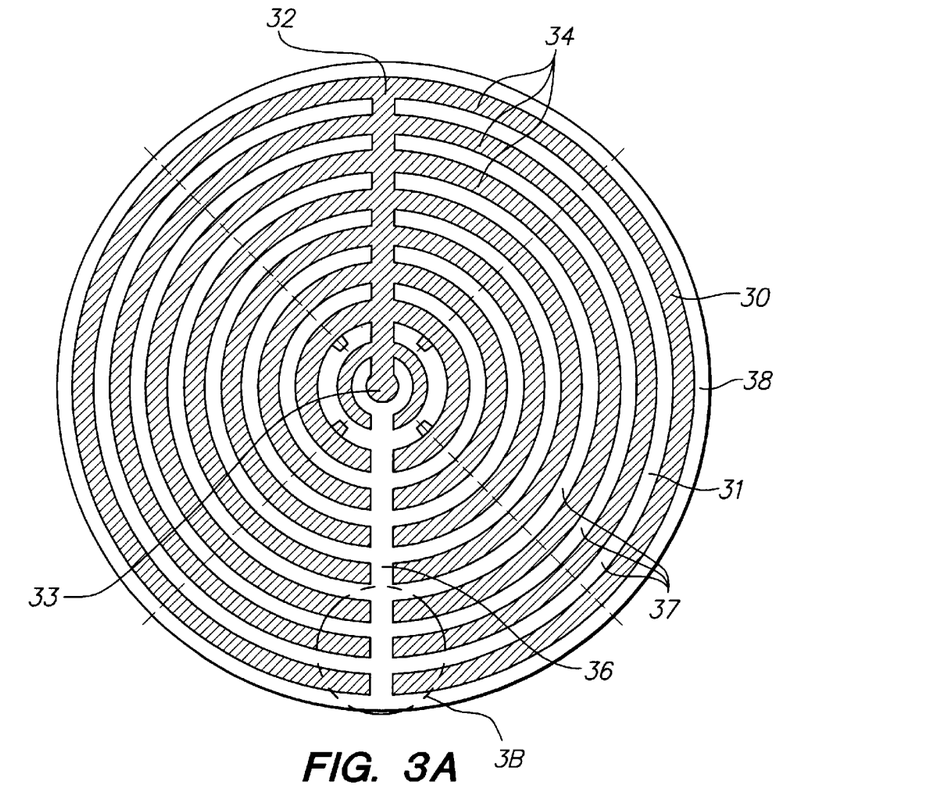
FIG. 3A shows a top plan view of an electrode pattern according to one embodiment of the present invention and FIG. 3B shows a detail from FIG. 3A.
Figure 3B:
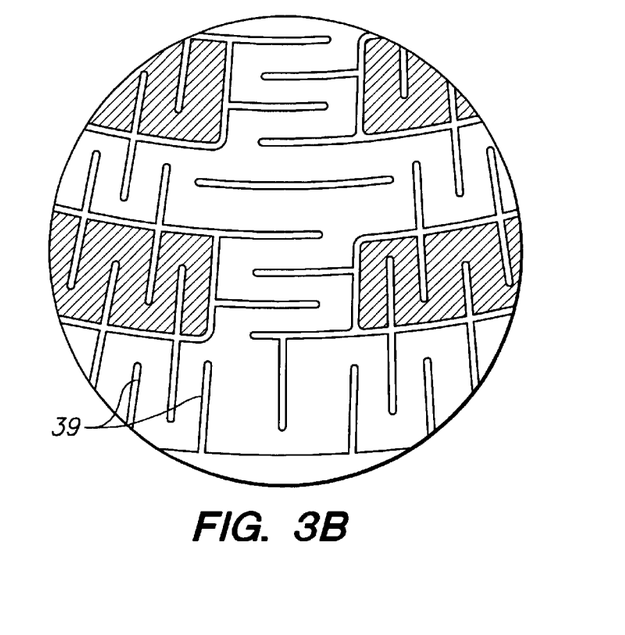

Exemplary electrode patterns according to the invention are shown in FIGS. 3A and 3B and FIGS. 4A and 4B. FIG. 3A shows a top plan view of a bipolar electrode according to the present invention. The electrode comprises a first electrode 30 and a second electrode 31. The first electrode 30 comprises a radially oriented linear segment 32, a disc portion 33 arranged in the center of the pattern and a plurality of "C-shaped" ring portions 34 positioned at predetermined intervals and having different diameters arranged on both sides of the linear segment 32 of the electrode so as to surround the disc portion 33. The second electrode 31 comprises radially oriented linear segment 36, a plurality of "C-shaped" ring portions 37 located at predetermined intervals and having different diameters and extending in "C" shapes on both sides of the linear segment 36 of the electrode and interleaved with the plurality of the C-shaped ring portions of the first electrode. Furthermore, the second electrode 31 comprises a circular ring portion 38 connected to an outer edge of the linear portion so as to form the outermost peripheral portion of the electrode. As shown in the detail in FIG. 3B, the electrodes have slits 39 formed therein to prevent the build-up of stress. The slits 39 are formed alternately on each side of the strip. Further, some of the slits in one electrode are arranged in alignment with adjacent slits in the other electrode. The slits separate each electrode into segments, some of which are joined to an adjacent segment only on one end and others of which are joined to an adjacent segment at both ends thereof. The slits 39 are arranged such that the maximum straight line length of the electrode is 1.0 inch or less, more preferably 0.5 inches or less, and even more preferably 0.25 inches or less.

Figure 4A:
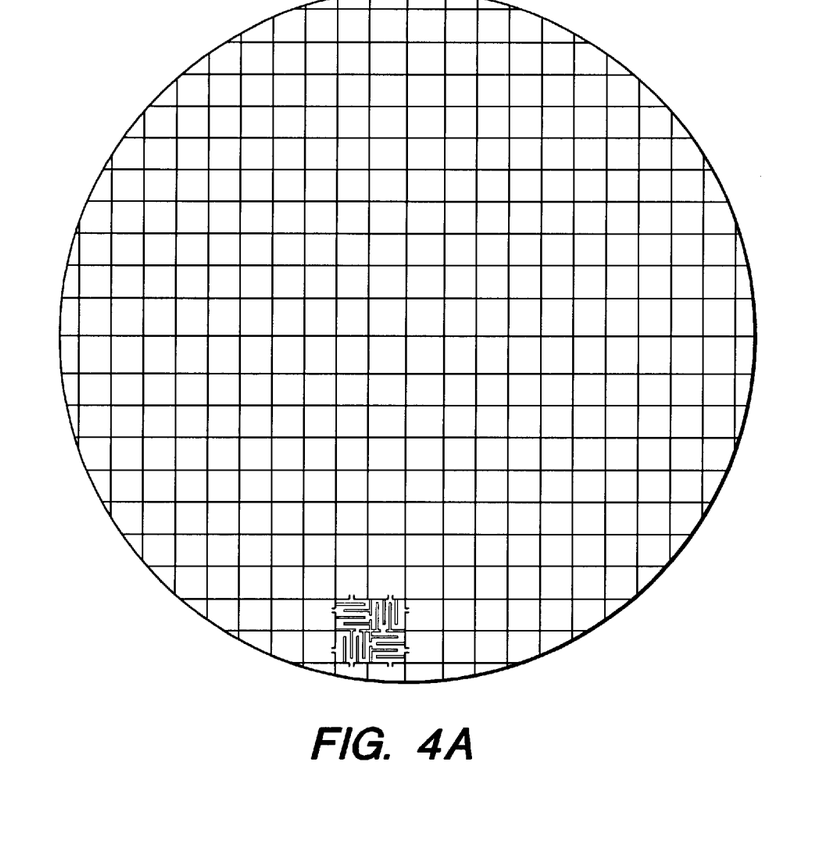
FIG. 4A shows a top plan view of a second electrode pattern according to the present invention and FIG. 4B shows a detail from FIG. 4A.
Figure 4B:
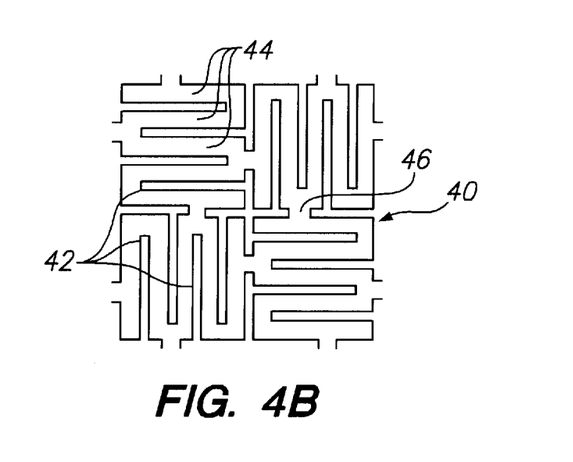

The electrode pattern in FIGS. 4A and 4B is a monopolar pattern comprising a plurality of finely divided groups 40 of unidirectionally oriented electrode segments 44, wherein each segment 44 in a group 40 is connected to an adjacent segment. The interior segments of the group are connected to adjacent segments at alternating ends thereof. As shown, narrow rectilinear gaps (slits) 42 separate the adjacent segments 44 of the electrode. The segments 44 of adjacent groups 40 are oriented perpendicularly to one another. Additionally, some of the segments in one group are joined by connections 46 along a side edge thereof to an end of other segments in an adjacent group.

The patterns shown in FIGS. 3 and 4 are only representative of the patterns that may be used to construct a finely divided electrode pattern in accordance with the invention. The electrode pattern of the present invention may be made up of a repeated pattern of short interconnected segments, the repeating pattern extending uniformly across the chuck body or forming strip-like sections extending in radial, circumferential linear and/or mutually parallel directions across the chuck body, the segments being arranged to provide a maximum straight line length of 1.0 inch or less, more preferably 0.5 inches or less, and even more preferably 0.25 inches or less. Conventional electrode patterns can be modified to provide a finely divided electrode pattern in accordance with the invention. For example, such electrode patterns can be modified such that any straight line segments or segments having a high radius of curvature not meeting the aforementioned criteria are broken up with slits or some other means to prevent the build-up of thermal stresses.

The width of the electrode strips is preferably 0.25 inches or less and more preferably 0.125 inches or less. The spacing between the electrode strips is not critical. It is usually desirable to minimize the spacing between electrodes in order to maximize the total exposed area of the electrodes to improve clamping force. The minimum spacing may be limited by the techniques used to form the electrode pattern, e.g., the printing technique used to form the pattern. Using silk screening techniques, spacings of less than 0.3 mm can be achieved.

The amount of deformation of the chuck during sintering is influenced not only by the amount of stress developed during sintering but also by the ability of the sintered ceramic chuck to resist deformation. Therefore, various factors in addition to the aforementioned CTE differences can influence warping of the chuck. These factors include the processing conditions employed during sintering (particularly temperature), the elastic modulus of the ceramic material and geometric factors such as the thickness of the chuck and the position of the electrode with respect to the major surfaces (thickness direction) of the chuck. Thus, if the electrode is closer to one of the major external surfaces of the chuck than the other, the stresses induced in the chuck by sintering will have a greater tendency to cause warping than if the electrode is centrally located. Even if the electrode is centrally located, however, some warping can still occur. Further, reducing the stresses during sintering can also be desirable to prevent the chuck from becoming damaged during sintering. The residual stresses that build up during sintering could eventually lead to cracking of the ceramic substrate or delamination of the electrode layer.

The inventive electrode design can be incorporated in various substrate support arrangements including those illustrated in FIGS. 5–8.

Figure 5:
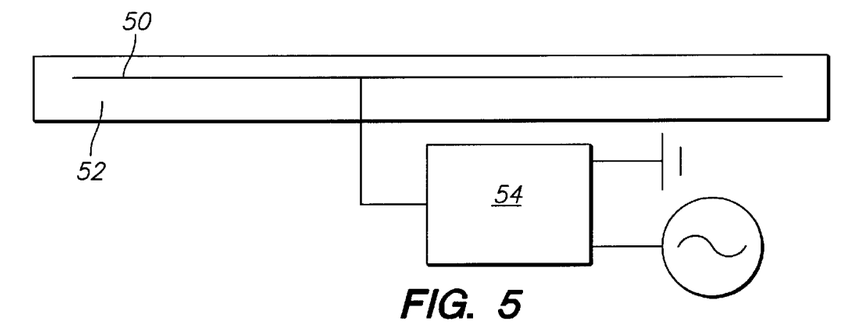
FIG. 5 shows one embodiment of an electrostatic chuck arrangement according to the present invention wherein DC clamping voltage and RF power are applied to a single electrode embedded in a ceramic body.

FIG. 5 shows an embodiment wherein the clamping electrode 50 is used to supply RF energy. As shown in FIG. 5, DC and RF energy are supplied to matching network/DC filter 54 the output of which is supplied to electrode 50. Electrode 50 is shown embedded in an insulating or semi-conductive body 52. With this arrangement, the electrode or electrodes are generally designed to be sufficiently conductive and thick to allow for RF powering without significant heat build-up.

Figure 6:
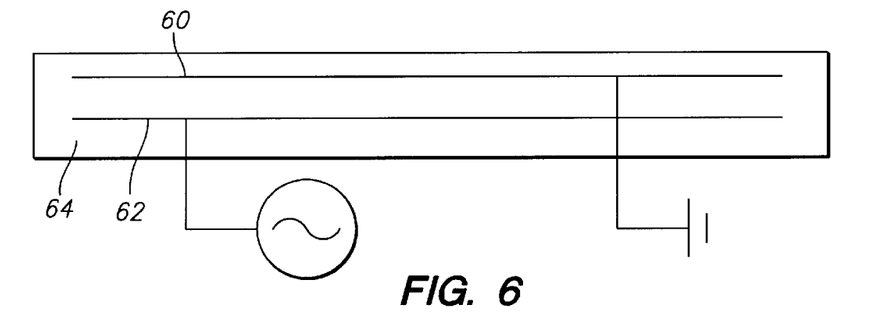
FIG. 6 shows a second embodiment of an electrostatic chuck arrangement according to the present invention wherein DC clamping voltage and RF power are applied to separate electrodes embedded in an insulative or semi-conductive body.
Figure 7:
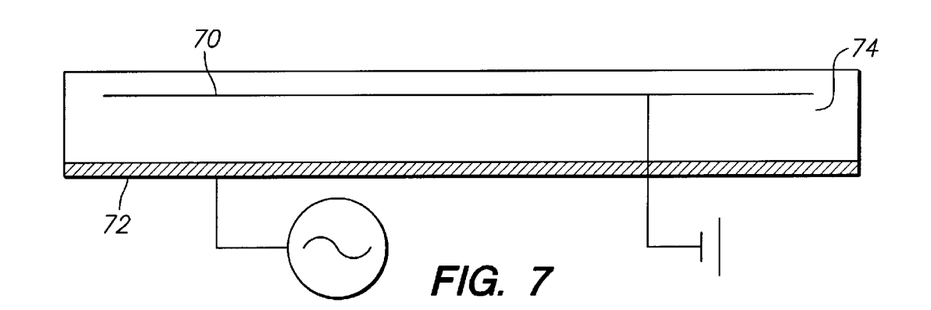
FIG. 7 shows a third embodiment of an electrostatic chuck arrangement according to the present invention wherein DC clamping voltage is applied to a clamping electrode embedded in an insulative or semi-conductive body and RF power is applied to a lower electrode formed on the surface of the body opposite the substrate support surface.

FIGS. 6 and 7 show embodiments wherein RF power is applied to a second electrode (RF electrode) underlying the clamping electrode. In FIG. 6, both the second electrode 62 and the clamping electrode 60 are embedded in an insulative or semi-conductive body 64. In FIG. 7, the clamping electrode 70 is embedded in an insulating or semi-conductive body 74 and the second electrode 72 is formed on the surface of the chuck body opposite the substrate support surface.

Figure 8:
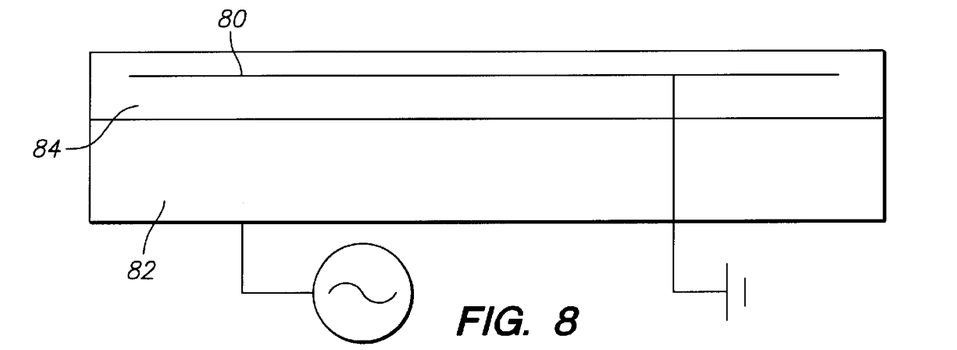
FIG. 8 shows a fourth embodiment of an electrostatic chuck arrangement according to the present invention wherein DC clamping voltage is applied to a clamping electrode embedded in an insulative or semi-conductive body and RF power is applied to a lower electrode underlying the body.

FIG. 8 shows an alternative embodiment wherein RF power is applied to an electrode in the form of a baseplate 82 underlying a clamping electrode 80 embedded in an insulating or semi-conductive body 84.

The electrostatic chuck according to the invention provides improved electrode flatness which advantageously influences the spatial uniformity of the clamping potentials developed on the chuck during use. Electrode flatness is particularly important for Coulombic (fully insulating) type chucks where the thickness of the dielectric layer above the electrode directly determines the clamping potentials developed on the chuck during use. In Johnson-Rahbek ("J-R") semi-conductive designs, the electrostatic charge migrates to the clamping surface of the chuck and the time asymptotic clamping field is therefore not directly related to the actual dielectric thickness. With J-R chucks, however, there can be transient effects that occur while the electrostatic charge redistributes (e.g., during initial chuck powering or during de-chucking) can be influenced, however, by the dielectric thickness of the ceramic layer above the electrode. These effects can be significant with respect to obtaining fast and uniform wafer release. Electrode flatness is therefore desirable for both Coloumbic and semi-conductive J-R chuck designs.

According to the second embodiment of the invention, an ESC is provided which can improve RF coupling uniformity when RF power is coupled through the clamping electrode and into an open space above the substrate being processed. This embodiment of the invention can be used with the chuck arrangements shown in FIGS. 6–8.

RF transparency can be achieved if the clamping electrode material is relatively resistive such that the thickness of the electrode is substantially less than a skin depth thick at the frequency of interest. The skin depth is the point at which an applied electric field is reduced by a factor of 1/e as it penetrates into a material. Skin depth is proportional to both the inverse square root of conductivity and to the inverse square root of frequency. Thus, higher conductivities and higher RF frequencies both result in lower skin depths and hence lower RF transparency. Consequently, by reducing the conductivity of the clamping electrode the RF transparency can be increased for a given electrode thickness.

Conventional ESC electrodes made of highly conductive materials such as tungsten, molybdenum or tantalum can interfere with the RF energy passing therethrough. With a conventional ESC, the conductive clamping electrode can essentially become capacitively coupled to the RF electrode or baseplate. Due to the high electrical conductivity of conventional clamping electrodes, the RF energy "coupled" into the clamping electrode becomes spatially redistributed within the clamping electrode. In this manner, the clamping electrode behaves like an RF equipotential surface. The ESC electrode in a conventional ESC can thus be viewed a floating plate between the RF electrode or baseplate and the reactor chamber. As a result of these effects, the local RF current density can be dependent upon the distance (d) between the clamping electrode and the upper surface of the chuck. Spatial variations in this distance, which are typically present in conventional electrostatic chucks, can thus result in non-uniform RF coupling through the chuck.

When the clamping electrode forms an equipotential surface, the RF energy can be viewed as being coupled from the clamping electrode and not the underlying RF electrode. The distribution of RF coupling into the plasma reactor therefore becomes dependent upon the distance (d) between the clamping electrode and the upper surface of the chuck (capacitance being inversely proportional to dielectric thickness). Therefore, RF coupling uniformity is dependent on the spatial uniformity of the thickness (d). Since the RF energy will tend to flow through areas with higher capacitance, any non-uniformity in the thickness (d) of the ESC clamping electrode can cause non-uniform RF coupling into the reactor.

The present inventors have discovered that the RF coupling uniformity can be improved by:

1) increasing the resistivity of the clamping electrode; and/or 2) increasing the lateral impedance of the clamping electrode by other means such as making the electrode thinner.

Increasing the resistivity of the clamping electrode allows the clamping electrode to become more transparent to the RF energy being coupled therethrough. Accordingly, with more resistive clamping electrodes, less RF energy is "coupled" from the RF electrode to the clamping electrode. Second, by increasing the lateral impedance of the clamping electrode, any RF energy which is "coupled" from the RF electrode into the clamping electrode is less likely to be redistributed across the plane of the clamping electrode. Further, by increasing the lateral resistance uniform coupling of the RF energy into the plasma can be achieved with clamping electrodes which are flat or non-flat with respect to the clamping surface of the chuck body.

The resistivity of the clamping electrode can be increased by various means including: (1) using a more resistive material for the clamping electrode; (2) diluting a conventional conductive material such as tungsten with an electrically insulating material such as alumina; or (3) introducing porosity into the clamping electrode. The lateral impedance can also be increased by increasing the resistivity of the electrode or, alternatively, by providing the clamping electrode in the form of a finely divided or convoluted pattern, which increases path length of the electrode.

As an example, higher RF transparency as well as higher lateral impedance can be achieved in a clamping electrode by using an ESC clamping electrode made from an electrode material comprising a mixture of an electrically conductive metallic material and a non-conductive filler. Thus, by incorporating an electrically insulating filler such as alumina into an electrically conductive refractory metal such as tungsten, titanium, molybdenum, niobium or the like, the electrical resistivity of the resulting composition can be increased significantly. For example, tungsten with a 45 percent volume loading of alumina can have an electrical resistivity that is approximately 1000 times that of unfilled tungsten. The skin depth of an electrode made of this material would therefore be more than 30 times as great as that of a conventional tungsten electrode and, for a given electrode thickness, significantly more RF energy would pass through the high resistivity electrode than through a conventional conductive electrode having the same shape and dimensions. Additionally, any increase in resistivity will also increase the lateral impedance of the clamping electrode.

The resistivity of the electrode can also be increased by introducing porosity into the electrode. Porosity can be generated in a refractory metal paste during sintering by incorporating certain known void forming additives into the paste composition.

In the present invention, the ESC clamping electrode preferably has a surface resistivity of at least about 1, preferably at least 10 ohms/square. Surface resistivity can be derived from volume resistivity by dividing the volume resistivity of the electrode by the electrode thickness. In a preferred embodiment of the invention, the clamping electrode is made from a refractory metal frit comprising an insulative or semi-conductive ceramic (e.g., alumina) and from 10 to 80 wt. % of a refractory metal (e.g., tungsten). In a further preferred embodiment, the refractory metal frit comprises from 30 to 50 wt. % refractory metal.

A finely divided clamping electrode pattern can be used to increase the lateral impedance of the clamping electrode and hence the spatial uniformity of RF coupling. As the line widths of the strips of electrode material become smaller and the electrode pattern becomes more finely divided (e.g., with alternating slits as illustrated in FIGS. 3 and 4) and/or circuitous, the lateral impedance of the clamping electrode will increase. The lateral impedance is essentially proportional to the distance of the conductive path (path length) between different points on the electrode pattern. By using a finely divided pattern, the path length or distance between two points on the clamping electrode will increase thus increasing the lateral impedance.

Since the clamping electrode is essentially transparent to RF energy, RF coupling uniformity can be influenced by the flatness and uniformity of the RF electrode underlying the clamping electrode. Therefore, in a preferred embodiment, the RF electrode is both substantially planar and a good RF conductor. In a further preferred embodiment, the connections between the RF power supply and the RF electrode are sufficient to promote the spatial uniformity of the RF energy distribution across the RF electrode. RF uniformity can be influenced by the number, size and placement of the connections from the RF power supply to the RF electrode. In a preferred embodiment, the RF electrode is a continuous unbroken layer of a highly conductive material. In a further preferred embodiment, the RF power is applied to a central region of the RF electrode using a single connection to improve the distribution of RF energy across the electrode surface.

The electrostatic chuck body according to the invention can be made from any suitable insulating or semi-conductive material. Suitable materials include ceramics, polymers (e.g., polyimide) and elastomers (e.g., silicone rubber). Further, an insulating layer between the clamping electrode and the substrate support surface may be made from the same material or from a different material than the remainder of the chuck body.

In a preferred embodiment, the electrostatic chuck according to the present invention is a ceramic electrostatic chuck. The ceramic chuck can be made by sintering together ceramic green sheets sandwiching an electrode pattern to provide a joint free monolithic body. Alternatively, the electrode pattern can be disposed on a first pre-fired ceramic layer and additional ceramic material can then be added to cover the electrode layer. For example, a ceramic material could be bonded on a pre-fired ceramic layer having an ESC electrode therebetween. Alternatively, the clamping electrode layer can be disposed on a pre-sintered compact and a layer of ceramic, polymer or other insulating or semiconductive material deposited thereon by, for example, CVD, sputtering, or other techniques such as thermal spraying (e.g. plasma or flame spraying).

The electrode pattern can be formed by various methods. For example, a continuous layer of conductive material can be deposited and conductive material selectively removed to form the pattern. Selective removal can be accomplished by dry etching (e.g., laser, plasma, etc.) or wet etching (e.g., acid, chemical, etc.) or by mechanical means such as sand blasting, grinding, etc. Alternatively, the electrode can be formed by selective deposition of the conductive material in a desired pattern. In a preferred embodiment of the invention, the electrode is applied in the form of a paste or ink comprising particles of an electrically conductive material by any suitable techniques. The paste, for example, can be silk screened in a desired pattern on a ceramic green sheet. Examples of suitable conductive particles include metals such as tungsten, molybdenum, tantalum, niobium and titanium and conductive ceramics such as titanium nitride. The paste may include known additives such as sintering aids.

The electrostatic chuck of the present invention can be a Johnson-Rahbek ("J-R") semi-conductive ceramic chuck or a Coulombic (fully insulating) chuck. With Coulombic chucks, the ceramic layer above the electrode can be relatively thin (e.g., 0.2 to 0.3 mm or less) to provide adequate clamping field at practical voltages. With J-R chucks, however, the layer above the electrode can be significantly thicker (e.g., up to 1 mm) since the semiconductive ceramic allows charges to migrate toward the surface of the chuck thereby reducing the effective thickness of the dielectric layer. In the case of J-R chucks, the ESC clamping electrodes are generally of sufficiently low resistance to dominate dielectric leakage to allow for sufficiently fast chucking and de-chucking. The use of excessively resistive ESC clamping electrodes in either Coulombic or J-R chucks is undesirable. In either chuck type, unacceptable chucking/dechucking times may occur due to the large RC time constant. In the case of a J-R chuck, the leakage current may drain away charge faster than the electrode can supply it such that sufficient and uniform clamping force may not be achieved. Consequently, the desire for RF transparency (high resistivity) in J-R chucks can be balanced against the need to maintain a certain desired level of dielectric leakage from the clamping electrodes.

The ceramic material employed for the ESC assembly of the present invention can be any suitable ceramic material. Suitable materials include high resistivity silicon carbide and alumina for fully insulated chucks and aluminum nitride and alumina doped with titanium dioxide for J-R chucks. For semiconductive (J-R) chucks, the ceramic material preferably has a resistivity within a range of $1 \times 10^{11}$ to $1 \times 10^2$ ohm/cm, it being understood that resistivity varies with temperature and applied voltage measurement conditions, e.g., at 20° C. and 4000 volts per millimeter thickness of electrode.

Power can be supplied to the clamping electrode through one or more lead wires or other suitable arrangements including metal vias formed in the ceramic. These vias can be formed by known techniques used in multi-layer ceramic packaging technology. See, for example, commonly owned U.S. Pat. No. 5,880,922 to Husain. For instance, holes may be punched in the ceramic green sheet and filled with the conductive paste prior to sintering. The chuck can also include openings for lift pins and passages to allow for a heat transfer gas to be supplied to the chuck surface. The surface of the chuck may also include surface grooves or channels for the distribution of a heat transfer gas as is known in the art. The chuck may further include additional ceramic and metallized layers. Other metallized layers which may be provided in the ESC include electrodes for heating or for the separate application of RF power.

A layer of a high temperature polymer adhesive such as a silicone adhesive can be used to bond the ceramic ESC to an underlying support or base electrode. The ESC, however, could also be attached to the underlying support using other joining techniques known in the art such as brazing.

Although the present invention has been described in connection with preferred embodiments thereof, it will be appreciated by those skilled in the art that additions, deletions, modifications, and substitutions not specifically described may be made without departing from the spirit and scope of the invention as defined in the appended claims.

What is claimed is:

1. A sintered ceramic electrostatic chucking device, comprising:
   a substantially planar electrostatic clamping electrode embedded in a joint-free monolithic sintered ceramic body, the clamping electrode including at least one pattern of an electrically conductive material;
   wherein the maximum straight line length in the electrode pattern is 1.0 inch.

2. The chucking device of claim 1, wherein the maximum straight line length in the electrode pattern is 0.25 inches.

3. The chucking device of claim 1, wherein the clamping electrode comprises a single electrically conductive pattern forming a monopolar electrode arrangement.

4. The chucking device of claim 1, wherein the clamping electrode comprises at least two electrically isolated patterns of conductive material forming a bipolar electrode arrangement.

5. The chucking device of claim 1, wherein the ceramic material comprises insulating or semiconductive material.

6. The chucking device of claim 1, wherein the electrode comprises a finely divided electrode pattern comprising a repeating pattern of electrode segments separated by slits extending inwardly from outer peripheries of the electrode.

7. The chucking device of claim 1, wherein the electrode layer is closer to one of the major external surfaces of the sintered ceramic body than the other.

8. The chucking device of claim 1, wherein the electrode layer is approximately equidistant from each of the major external surfaces of the ceramic body.

9. The chucking device of claim 3, wherein the pattern of electrically conductive material is arranged in a plurality of small comb shaped groups.

10. The chucking device of claim 4, wherein each electrode comprises a plurality of small comb shaped groups.

11. The chucking device of claim 10, wherein at least one of the comb shaped groups of one pattern is interdigitated with at least one of the comb shaped groups of the other pattern.

12. The chucking device of claim 1, further comprising a radio frequency driven electrically conductive baseplate secured to a bottom surface of the sintered ceramic body.

13. A method of treating a semiconductor substrate in a process chamber comprising the electrostatic chucking device of claim 1, said method comprising steps of:
   electrostatically clamping the substrate to the electrostatic chucking device; and
   processing the substrate.

14. The method of claim 13, further comprising steps of coupling RF energy of at least one frequency through the electrostatic chucking device to generate a plasma adjacent the exposed surface of the substrate; and
   processing the substrate with the plasma.

15. The method of claim 14, wherein the process chamber is a plasma etch chamber and the processing step comprises etching the substrate with the plasma.

16. The method of claim 13, further comprising applying DC electrical power to the clamping electrode to generate electrostatic clamping potentials on the electrostatic chucking device surface.

17. The method of claim 13, further comprising supplying process gas to the chamber and coupling the radio frequency energy into the chamber so as to energize the process gas into a plasma state, the substrate comprising a silicon wafer which is plasma etched during the processing step.

18. A method of making the ceramic electrostatic chucking device of claim 1, comprising steps of:
   providing a first layer comprising a ceramic material in a green state;
   forming a pattern of at least one strip of an electrically conductive material on a first major surface of the first layer;
   providing a second layer comprising ceramic material in green state;
   assembling the second layer on the first major surface of the first layer; and
   cofiring the first and second layers to form a monolithic joint-free sintered ceramic body with an embedded electrode layer.

19. The method of claim 18, wherein the forming step comprises forming a pattern from a paste comprising particles of an electrically conductive material and wherein the cofiring step comprises sintering the particles of the electrically conductive material to form a sintered clamping electrode.

20. The method of claim 18, wherein the first and second layers are ceramic green sheets.

21. An electrostatic chucking device useful for supporting semiconductor substrates in a semiconductor processing chamber comprising:
   a body of electrically insulating or semi-conductive material having a support surface on which a semiconductor substrate can be electrostatically clamped;
   a clamping electrode adapted to electrostatically clamp a semiconductor substrate to the support surface; and
   a lower electrode adapted to couple radio frequency energy through the clamping electrode and into an open space in the vicinity of a substrate clamped to the support surface;
   wherein (a) the clamping electrode has a sufficiently high resistivity such that the clamping electrode is highly transparent to the coupling of radio frequency energy into the plasma chamber and/or (b) the clamping electrode has a sufficiently high lateral radio frequency impedance in a direction parallel to the support surface such that the radio frequency power coupled into the plasma chamber is substantially uniformly distributed across the substrate support surface.

22. The electrostatic chucking device of claim 21, wherein the clamping electrode has a surface resistivity of about 10 ohms/square or greater.

23. The electrostatic chucking device of claim 21, wherein the clamping electrode includes at least one pattern of an electrically conductive material and wherein the pattern has a maximum straight line length of 1.0 inches.

24. The electrostatic chucking device of claim 21, wherein the clamping electrode is a continuous, unbroken film.

25. The electrostatic chucking device of claim 21, wherein the clamping electrode is located within the body and the lower electrode is either located within the body or attached to a surface of the body opposite the substrate support surface.

26. The electrostatic chucking device of claim 21, wherein the clamping electrode is located within the body and the lower electrode comprises a baseplate.

27. The electrostatic chucking device of claim 21, wherein the electrostatic chucking device is located within a plasma processing chamber.

28. The electrostatic chucking device of claim 21, wherein the clamping electrode comprises a sintered paste of an insulating or semi-conductive ceramic material comprising 10 to 80 wt. % of a refractory metal.

29. The electrostatic chucking device of claim 21, wherein the clamping electrode comprises a sintered paste of an insulating or semi-conductive ceramic material comprising 30 to 50 wt. % of a refractory metal.

30. A method of treating a semiconductor substrate in a process chamber comprising the electrostatic chucking device of claim 21, said method comprising steps of:

electrostatically clamping the substrate to the electrostatic chucking device; and coupling radio frequency energy of at least one frequency from the lower electrode through the electrostatic chucking device;

wherein the resistivity of the clamping electrode is such that a thickness of the clamping electrode is substantially less than a skin depth at the frequency of the radio frequency energy.

31. The method of claim 30, wherein the radio frequency energy generates a plasma adjacent an exposed surface of the substrate and/or biases the substrate, the method further comprising the step of processing the substrate with the plasma.

32. The method of claim 30, wherein the clamping electrode comprises an electrode material distributed in a sufficiently narrow and/or long enough pattern to increase point-to-point resistivity of at least 10 times that of a planar sheet of the same electrode material.

* * * * *